United States Patent
Ramakrishnan et al.

(10) Patent No.: US 8,174,759 B2
(45) Date of Patent: May 8, 2012

(54) APPARATUS FOR GAIN CONTROL IN OPTICAL AMPLIFIERS

(76) Inventors: Srikanth Ramakrishnan, Nepean (CA); Dusan Ivancevic, Ottawa (CA)

( * ) Notice: Subject to any disclaimer, the term of this patent is extended or adjusted under 35 U.S.C. 154(b) by 371 days.

(21) Appl. No.: 12/487,687

(22) Filed: Jun. 19, 2009

(65) Prior Publication Data
US 2009/0316255 A1    Dec. 24, 2009

Related U.S. Application Data

(60) Provisional application No. 61/073,800, filed on Jun. 19, 2008.

(51) Int. Cl.
*H01S 3/00* (2006.01)
(52) U.S. Cl. .............. 359/341.4; 359/341.43; 359/341.1
(58) Field of Classification Search .............. 359/341.4, 359/341.41, 341.43
See application file for complete search history.

(56) References Cited

U.S. PATENT DOCUMENTS

| | | | |
|---|---|---|---|
| 4,017,720 A | 4/1977 | Mattern | 708/103 |
| 5,966,040 A | 10/1999 | Gai et al. | 327/357 |
| 6,414,788 B1 | 7/2002 | Ye et al. | 359/341.41 |
| 6,757,099 B2 | 6/2004 | Pavel et al. | 359/341.4 |
| 6,836,355 B2 | 12/2004 | Lelic et al. | 359/341.4 |
| 6,989,923 B2 | 1/2006 | Stentz | 359/341.41 |
| 7,006,282 B2 | 2/2006 | Tian et al. | 359/341.41 |
| 7,388,711 B2 * | 6/2008 | Oota et al. | 359/341.3 |
| 2001/0043389 A1 * | 11/2001 | Bonnedal et al. | 359/341.41 |

* cited by examiner

*Primary Examiner* — Mark Hellner
(74) *Attorney, Agent, or Firm* — Teitelbaum & MacLean; Neil Teitelbaum; Doug MacLean

(57) ABSTRACT

The invention relates to an apparatus for dynamically controlling the gain of an optically pumped optical amplifier, and the optical amplifier including such apparatus, which utilizes a multiplying digital to analog converter to implement a digitally adjustable analog feed forward control of a source of pump radiation of the optical amplifier.

13 Claims, 10 Drawing Sheets

APPARATUS FOR GAIN CONTROL IN OPTICAL AMPLIFIERS

CROSS-REFERENCE TO RELATED APPLICATIONS

The present invention claims priority from U.S. Provisional Patent Application No. 61/073,800, filed Jun. 19, 2008, entitled "Using Multiplying Digital To Analog Converter As Building Control Blocks For Optical Amplifiers", which is incorporated herein by reference.

TECHNICAL FIELD

The present invention generally relates to optical amplifiers, and particularly relates to an apparatus for controlling the gain of an optical amplifier.

BACKGROUND OF THE INVENTION

Optical networks for long haul and metro area communication typically employ wavelength division multiplexing (WDM) or dense wavelength division multiplexing (DWDM) to increase transmission capacity. In WDM and DWDM networks, a number of optical channels are carried in each optical fiber at disparate wavelengths. Network capacity is based on the number of the wavelengths, or channels, in each fiber and the data rates of the channels. Individual channels can be added or dropped at network sites using optical multiplexing and demultiplexing equipment.

Optical amplifiers (OA) such as Erbium-doped fiber amplifiers (EDFA) are commonly used in optical long haul and metro networks to offset loss of light in optical fiber links and transmission and multiplexing/demultiplexing equipment at network sites. In EDFA designs, optical laser diodes, which typically emit at 980 nm or 1480 nm, are used as sources of pump radiation to provide optical energy to amplify weak optical input signals, typically in the 1500 nm to 1600 nm wavelength range.

The power of a WDM signal at the input of an optical amplifier employed in a WDM communication system can vary for a number of reasons. For example, power variations can be caused by an intentional increase or decrease in the number of channels for the purpose of routing traffic, by the unintentional loss of channels due to a fiber cut or human error, changes in span losses, and component loss changes due to aging or temperature fluctuations. The number of optical channels may be varying rapidly depending upon the number of added or dropped channels at a particular network site, resulting in a rapid change in the input optical power into the amplifier. Since the amplifier gain typically varies with the total input signal power, a change in the input optical power typically results in a change in the amplifier gain, unless the pump power is adjusted accordingly. Since the amplifier gain has to exactly offset loss in a transmission system, it is important to maintain a constant amplifier gain as the input optical power into the OA changes. This type of control is commonly referred to as an automatic gain control (AGC) or transient control. It is well known that AGC can be achieved by adjusting the pump power supplied to the optical amplifier. In general, the change in the pump power required to maintain constant gain depends not only on the input signal power level but also on the spectral content of the input signal.

Known techniques for implementing the transient control by controlling the pump power include feed-forward (FF) and feedback (FB) arrangements. In a feed-forward arrangement the pump power may be adjusted based upon changes to the input optical signal into the OA. It offers the advantage of a faster response time, but can also be inaccurate since it does not take into account variations in the amplifier due to aging of various components thereof and with temperature, the dependence of the optimum pump power on the spectral content of the input signal. In a feedback arrangement, parameters used to determine the appropriate pump power include at least one output parameter of the OA, such as the optical power of light at the amplifier output. Typically, the input and output optical signals of the OA may be detected and used to determine the actual gain G of the amplifier. This measured gain may then be used to adjust the pump power until the desired gain is achieved.

FIG. 1 illustrates an exemplary OA 1 having a typical gain control arrangement, wherein circuitry for controlling the pump power includes feed-forward and feedback portions. A WDM optical signal enters the OA 1 through an input optical port 2, is amplified in a gain section 8 of the amplifier, which typically includes a span of an erbium-doped fiber pumped by pump radiation from a pump laser diode (LD) module 10, and leaves the OA 1 from an output port 7, with its power increased in accordance with a current value of the amplifier gain G. The pump power provided by the pump module 10 is controlled by a pump control circuit 5. The FF signal is obtained by tapping off a small portion of the input optical signal using an optical tap 3, and converting it into an electrical signal with an input photodetector (PD) 4. Similarly, the FB signal is obtained by tapping off a small portion of the output optical signal using an output optical tap 9, and converting it into an electrical signal with an output photodetector 6. The pump control circuitry 5 generates a pump control signal based on the FF and FB signals obtained from the PDs 4 and 6, and applies it to the pump module 10, such as to vary the pump current into the pump LD to maintain a constant gain in the OA gain section 8.

One known approach to obtaining the pump control signal based on the input and output power of the OA, as read by the PDs 4 and 6, is to utilize a digital signal processor (DSP) programmed with a suitable control algorithm to control the pump current of the pump LD 10. Such an implementation of the OA control circuitry is illustrated in FIG. 2, and requires using two fast analog to digital converters (ADCs) 11 to convert the analog FF and FB signals from the PDs 4, 6 into the digital domain prior to providing it to the DSP 5, and a fast digital to analog converter (DAC) at the input of the pump control module 10. The DSP 5 may run a firmware-implemented PID (Proportional-Integral-Derivative) control loop, which typically has to be closed faster than 1 microsecond (μsec), and may run two different control algorithms, one based exclusively on the FF signal, and one based on the FB signal or both the FF and FB signals. One drawback of this digital approach is that it requires having high-speed digital electronics, such as very fast ADCs 11 with a sampling rate greater than 1 Msps (Mega sample per second), a very fast DAC 12, and a fast DSP 5, resulting in a high cost and a high power consumption by the OA control circuitry.

An object of the present invention is to overcome at least some of the shortcomings of the prior art by providing an apparatus for controlling the gain of an optical amplifier that is fast, stable and requires little electrical power to operate.

SUMMARY OF THE INVENTION

In accordance with the invention, there is provided an apparatus for controlling a gain of an optical amplifier (OA), the optical amplifier comprising an optically pumped gain medium, the apparatus comprising: a first multiplying digitalto-analog converter (MDAC) having an analog input port for receiving a first electrical signal indicative of an optical power of input light entering the OA, a digital input port for receiving a digital feed forward (FF) gain control signal $D_{FF}$, and an output port for outputting an analog FF signal that is proportional to the first electrical signal and to the FF digital gain control signal $D_{FF}$; the apparatus further comprises a processor coupled to the digital input port of the first MDAC for generating the FF digital gain control signal $D_{FF}$, and an output circuit coupled to the output port of the first MDAC for outputting a pump control signal based at least in part on the analog FF signal for controlling a source of pump radiation of the OA.

In accordance with one aspect of this invention, the apparatus for controlling the gain of the OA further comprises a first analog to digital converter (ADC) for receiving the first electrical signal, for converting the first electrical signal into a first digital signal, and for passing the first digital signals to the processor, and a second ADC for receiving a second electrical signal indicative of an optical power of output light exiting the OA, for converting the second electrical signal into a second digital signal, and for providing said second digital signal to the processor, wherein the processor is programmed to generate the FF digital gain control signal $D_{FF}$ based upon a target gain value of the OA, and is programmed to generate a feed back (FB) digital gain control signal $D_{BF}$ based on the first and second digital signals.

Another aspect of the present invention relates to an optical amplifier comprising the apparatus for controlling the gain thereof that includes the first MDAC for feed forward analog control of the source of the pump radiation.

BRIEF DESCRIPTION OF THE DRAWINGS

The invention will be described in greater detail with reference to the accompanying drawings which represent preferred embodiments thereof, wherein.

DETAILED DESCRIPTION

The present invention provides an apparatus for controlling the gain of an optical amplifier (OA), which utilizes one or more multiplying digital-to-analog converters (MDAC) as control elements for implementing an OA transient control. Advantageously, we found that commercially available MDACs enable a fast, simple and cost-effective alternative to expensive all digital transient control schemes, and are more stable, accurate and consume less power than prior art analog control schemes for optical amplifiers.

Figure 1:
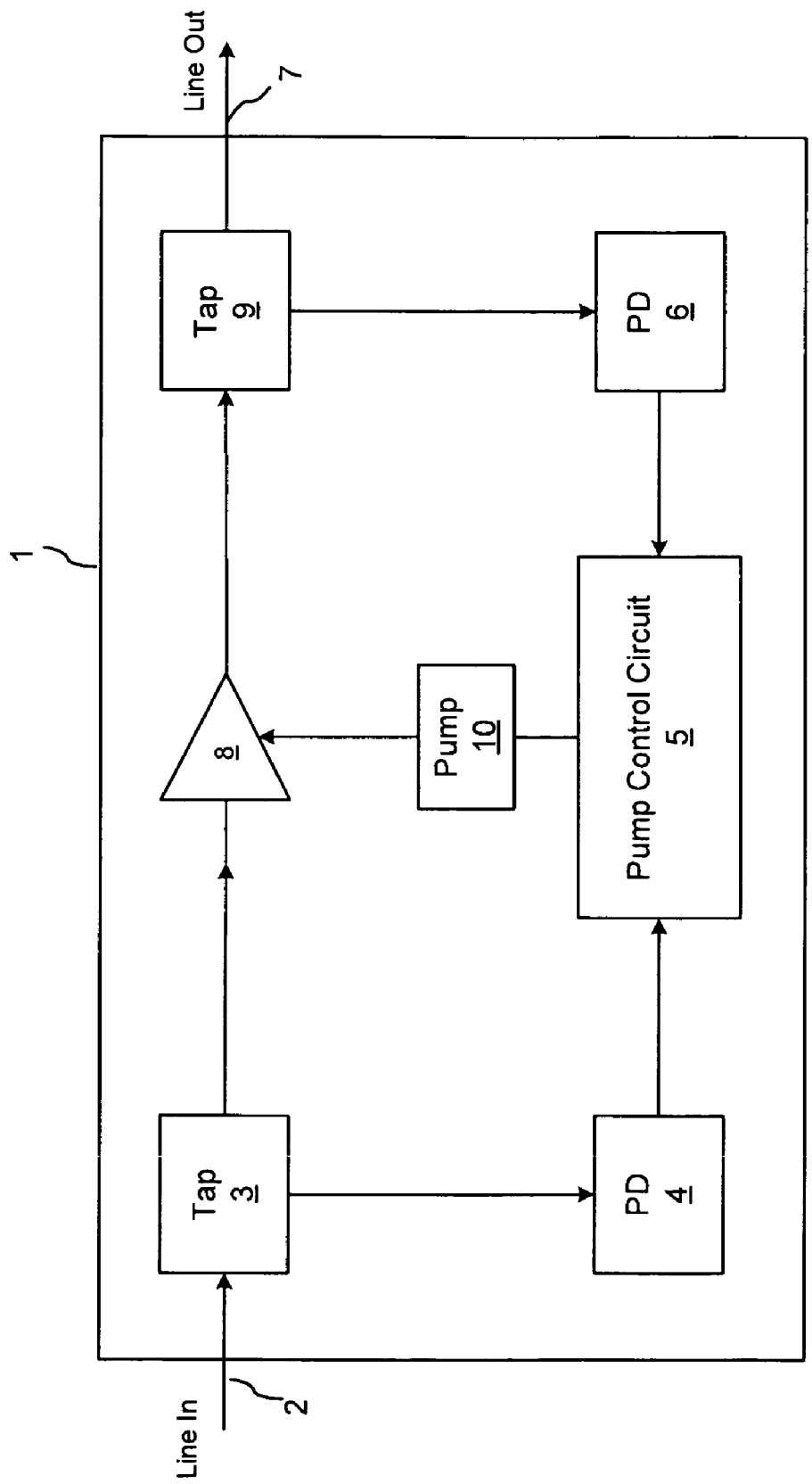
FIG. 1 is a block diagram generally illustrating an optical amplifier with a gain control circuit.
Figure 7:
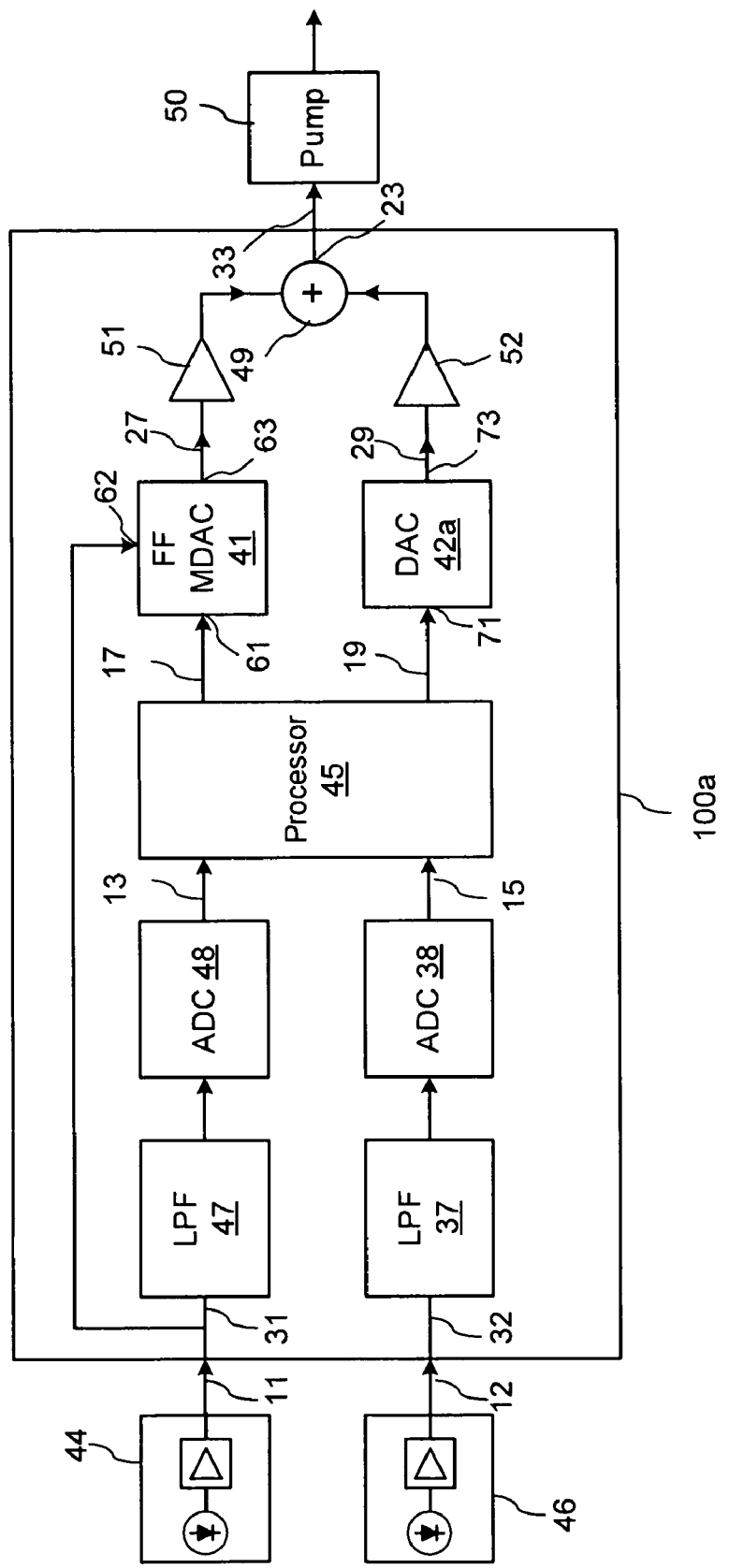
FIG. 7 is a diagram of an OA controller utilizing a MDAC in a feed forward circuit and a conventional DAC in a feed-back circuit according to an embodiment of the present invention.
Figure 8:
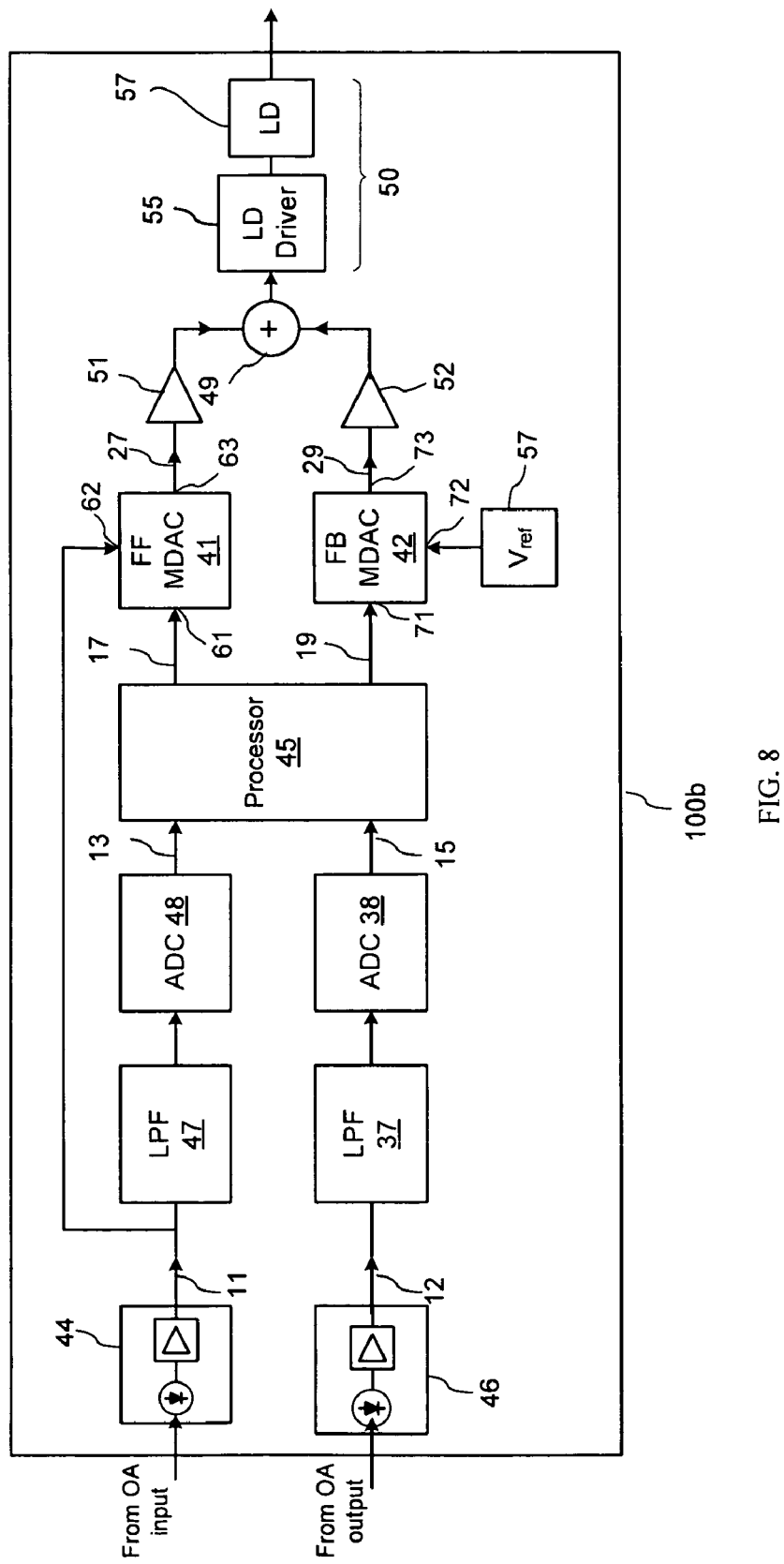
FIG. 8 is a diagram of a MDAC-based OA controller including two photodiodes and a source of pump radiation.
Figure 9:
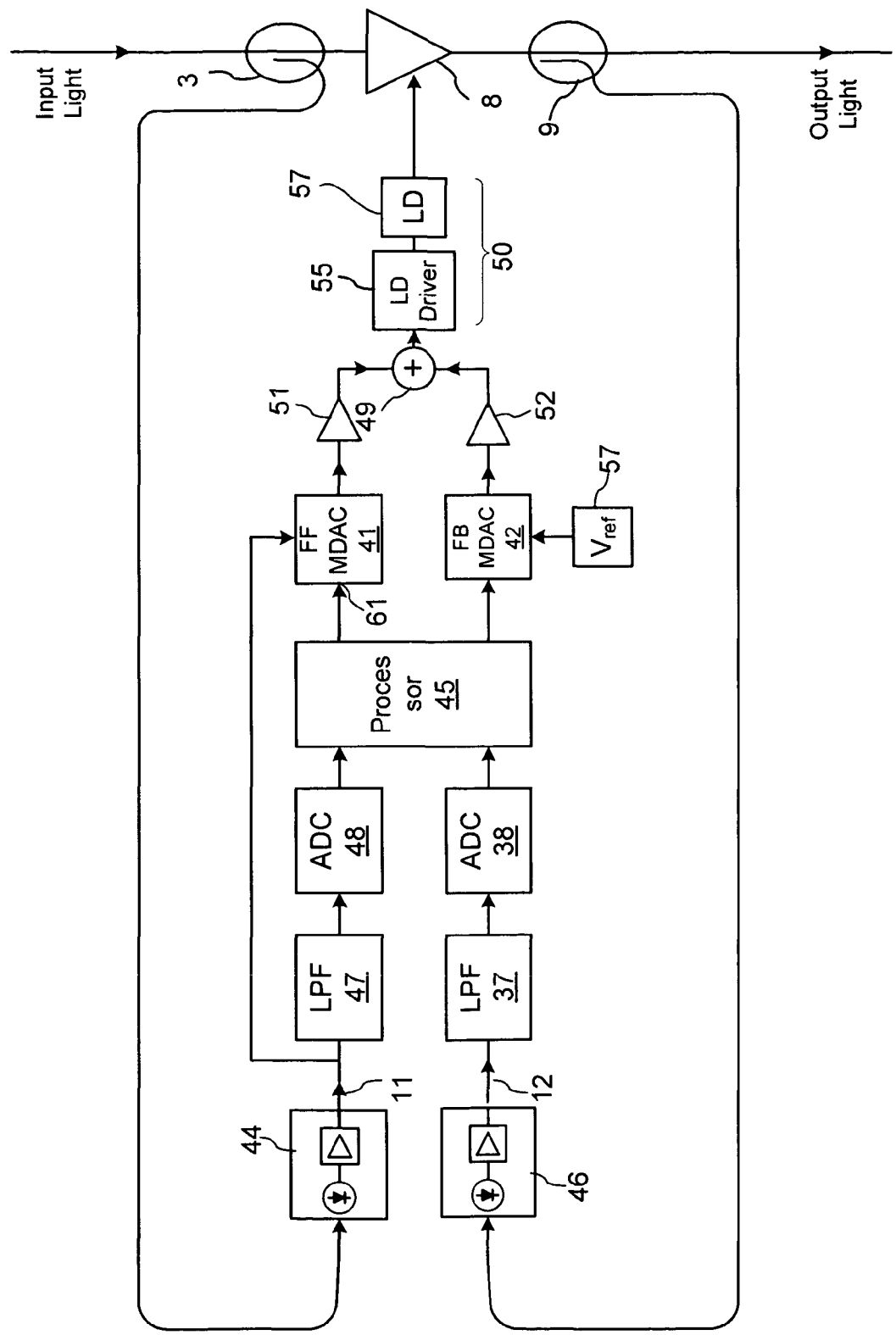
FIG. 9 is a block diagram of one embodiment of an optical amplifier utilizing an OA controller according to one embodiment of the present invention.
Figure 10:
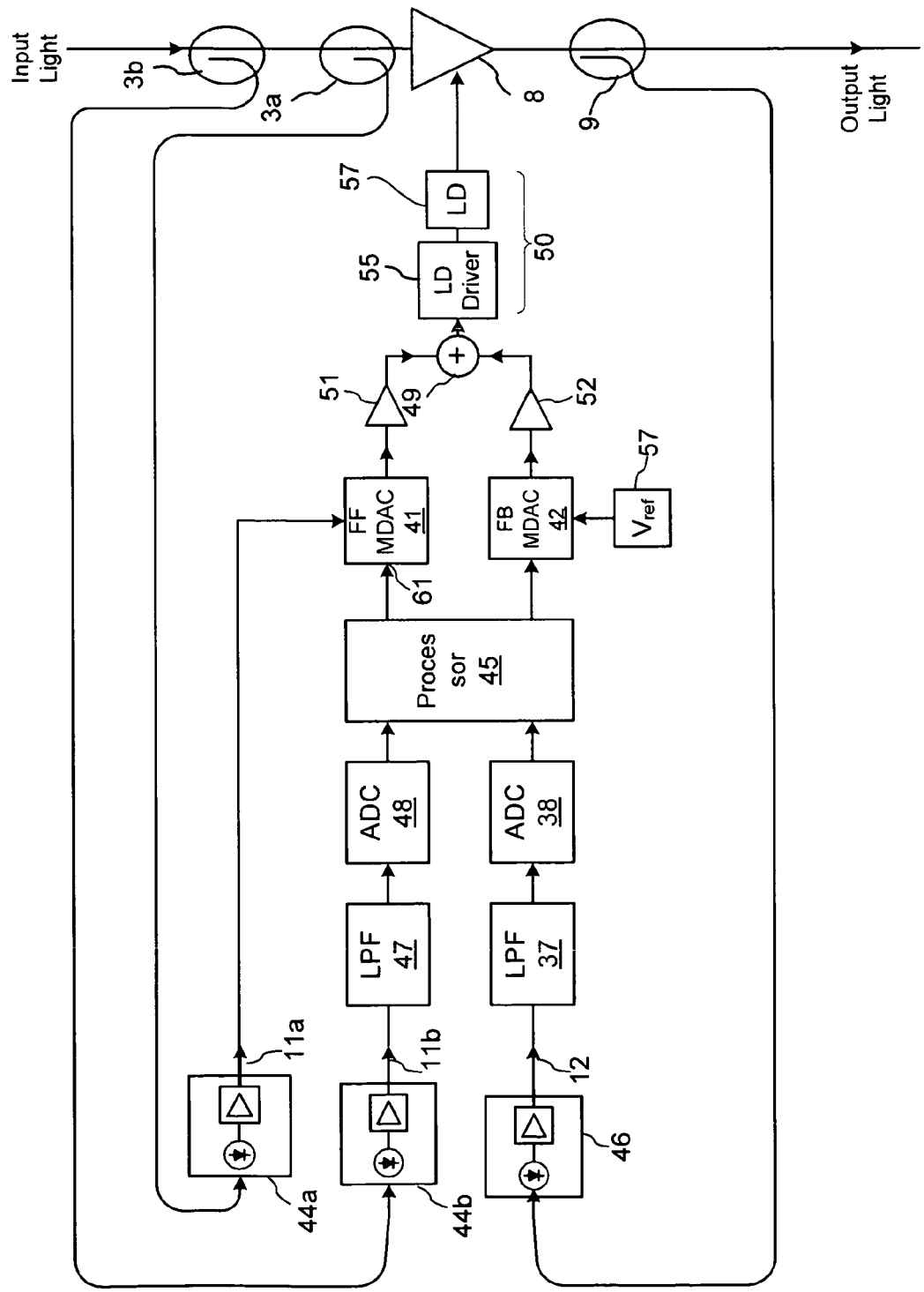
FIG. 10 is a block diagram of one embodiment of an optical amplifier utilizing two input couplers and an OA controller according to one embodiment of the present invention.

Exemplary embodiments of the apparatus for controlling the gain of an OA, which is also referred to herein as an OA controller, are shown in FIGS. 3, and 7 to 10, and are hereafter described in the context of an optical amplifier utilizing input and output optical taps to monitor changes in the power of optical signal before and after the OA, such as the OA 1 of FIG. 1. Exemplary embodiments of an OA utilizing elements of the present invention are illustrated in FIGS. 9 and 10.

Figure 3:
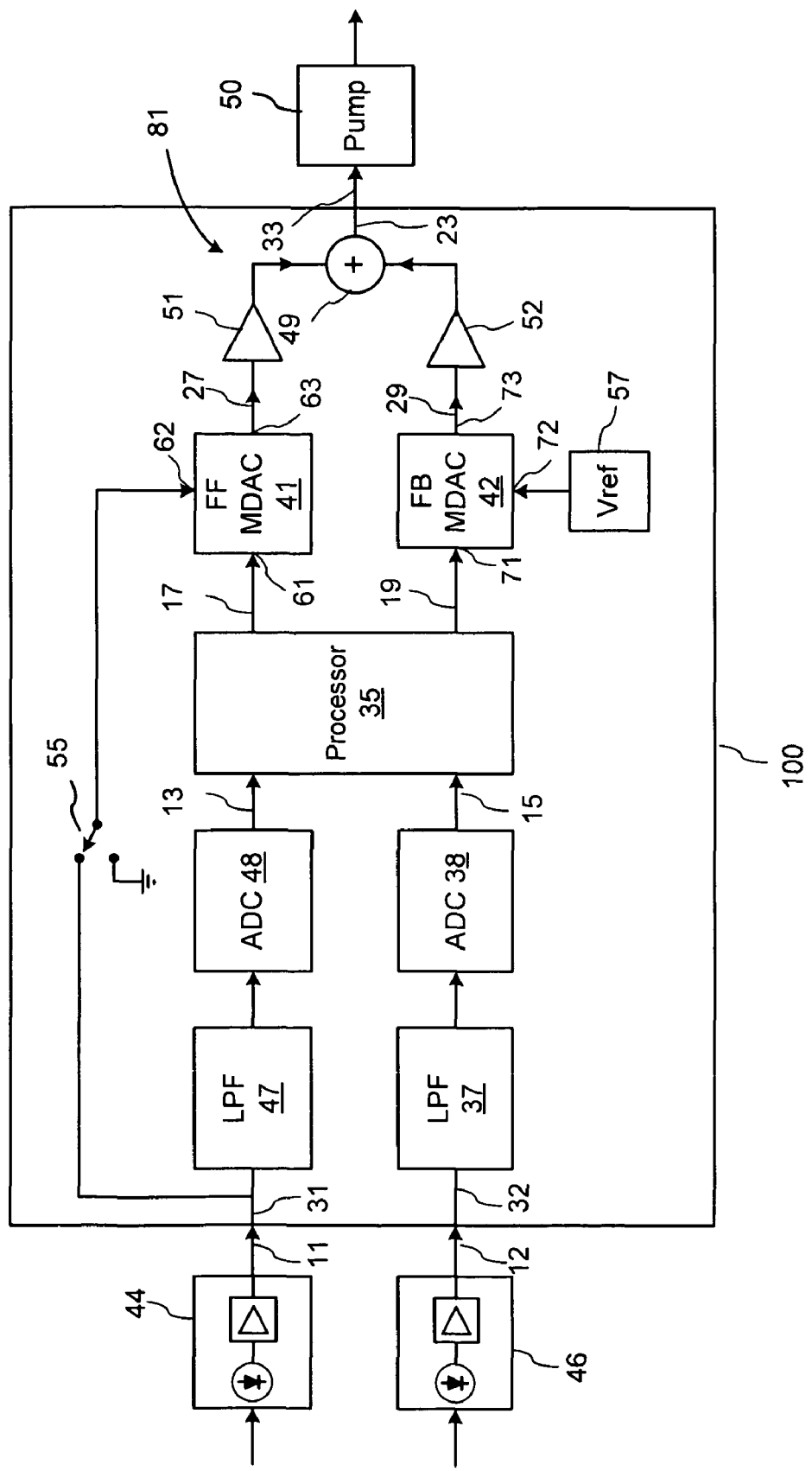
FIG. 3 is a block diagram of an OA controller utilizing two multiplying digital to analog converters (MDACs) according to an embodiment of the present invention.

With reference to FIG. 3, there is shown an OA controller 100 having a first input port 31 for receiving a first electrical signal 11 indicative of an optical power of input light entering the OA, a second input port 32 for receiving a second electrical signal 12 indicative of an optical power of output light exiting the OA, and, an output port 23 for providing a pump control signal 33 for controlling a source of pump radiation 50. The first and second input ports 31, 32 are optically coupled to photodetectors (PDs) 44 and 46, respectively, which in operation receive light from optical taps 3 and 9 at the input and output of a gain section 8 of the OA, as illustrated in FIG. 9, and produce therefrom the first and second input electrical signals 11 and 12. The PDs 44 and 46 are also referred to herein as the input and output PDs, respectively, and may each be in the form of a photo diode followed by a current to voltage converter, such as a trans-impedance amplifier (TIA), for converting a photocurrent generated by the photo diode into voltage. Accordingly, the first and second input signals 11, 12 are typically voltage signals, and will be denoted herein as $V_{in1}$ and $V_{in2}$, respectively. The source of pump radiation 50 may be in the form of a pump laser diode (LD) module and may include a pump LD and an LD driver that generates, based upon the pump control signal 33, a pump current $J_p$ that flows through the pump LD to produce the pump radiation.

The first input port 31 is electrically coupled to an ADC 48, which is also referred to herein as the first ADC or as the FF ADC 48, which in turn connects to a data port of a processor 35. Similarly, the second input port 32 is coupled to an ADC 38, which is also referred to herein as the second ADC or as the FB ADC 38, which also connects to the same or different data port of the processor 35. Anti-aliasing low pass filters (LPF) 47 and 37 may be provided in the electrical paths between the input and output PDs 44, 36 and the respective ADCs 48, 38. The processor 35 may be in the form of a digital signal processor (DSP), a field programmable gate array (FPGA), a microcontroller, a combination thereof, or any suitable hardware capable of executing software and/or firmware instructions.

The first input port 31 of the OA controller 100 is also electrically coupled, via an optional analog switch 55, to an analog input port 62 of an N-bit MDAC 41, which is also referred to herein as the first MDAC or the FF (feed forward) MDAC 41, where N can be for example 8, 10, 12, 14 etc. The FF MDAC 41 has a digital input port 61 that is coupled to an output data port of the processor 35 for receiving therefrom a first digital gain control signal $D_{FF}$ 17, which may be in the form of an N-bit binary word. The FF MDAC 41 also has an analog output port 63 that is coupled to an output circuit 81 that in the shown embodiment includes a current to voltage converter 51 in the form of a TIA, and a summer 49. The analog output port 63 of the FF MDAC 41 provides to the output circuit 81 an analog FF signal 27 that is proportional to the first input electrical signal 11 $V_{in1}$ and to the FF digital gain control signal $D_{FF}$ 17. The output circuit 81 is for producing a pump control signal 33 that is based at least in part on the analog FF signal produced by the FF MDAC 41 for controlling the pump source 50.

In one embodiment the FF MDAC 41 outputs the analog FF signal 27 in the form of an electrical current $J_{out1}$, which is then converted to an output voltage $V_{out1}$ by the TIA 51. Accordingly, the output voltage $V_{out1}$ is proportional to both the FF digital gain control signal $D_{FF}$ and the analog input voltage into the MDAC $V_{in1}$:

$$V_{out1} \cong -\frac{D_{FF} \cdot V_{in1}}{2^N} \quad (1)$$

Figure 4:
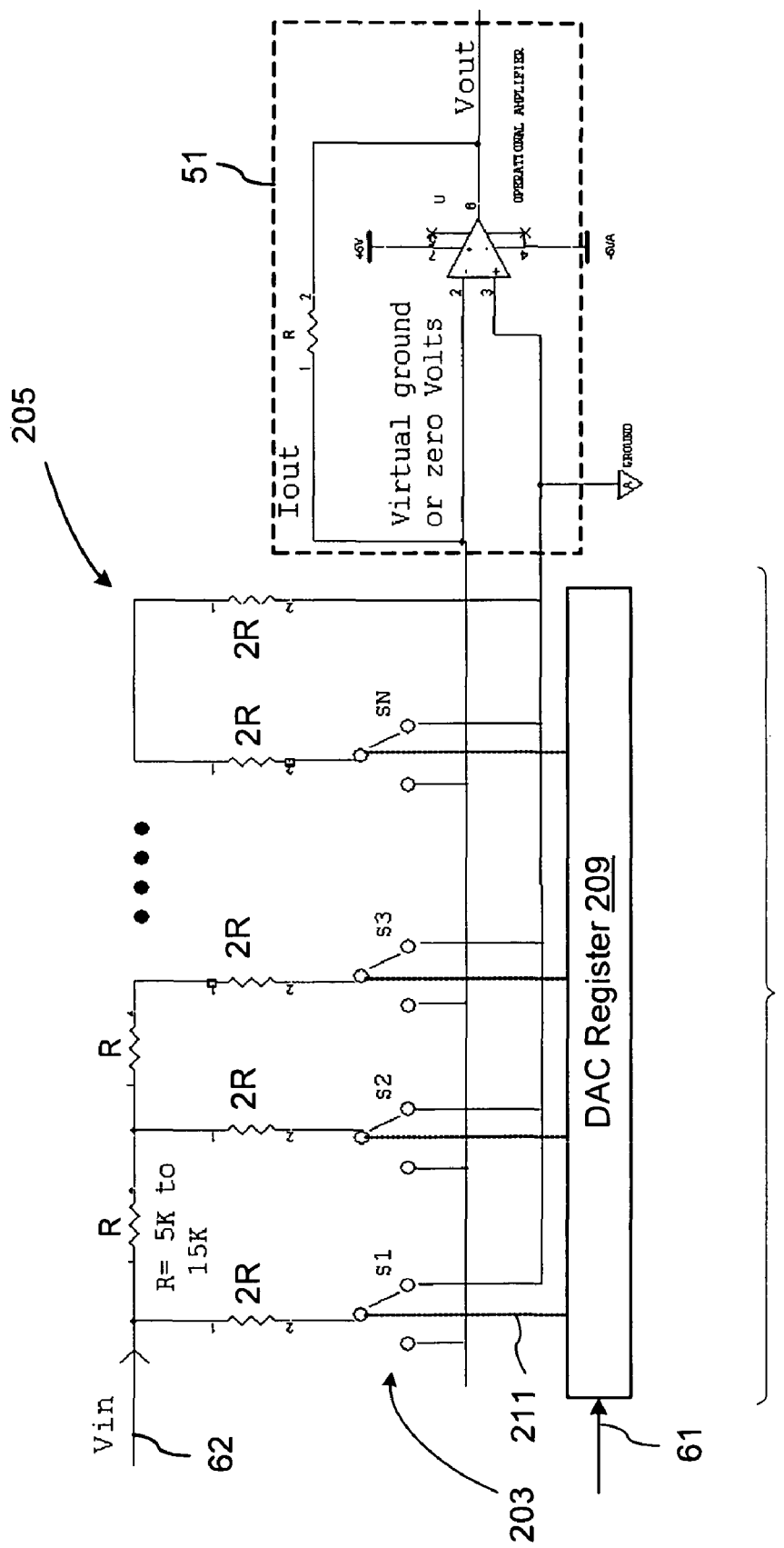
FIG. 4 is a schematic diagram of a MDAC utilizing an R-2R network followed by a trans-impedance amplifier.

FIG. 4 illustrates an electrical scheme of the FF MDAC 41 in one embodiment thereof, in connection with the TIA 51 that is based on an operational amplifier as known in the art. In the shown embodiment, the FF MDAC 41 includes a ladder R/2R network of resistors 205 with resistance values R and 2R as known in the art, with each "step" of the ladder coupled to a digitally controlled analog double-pole-single throw (DPST) switch 203. By way of example, R may be between 5 and 15 kΩ, and the R and 2R resistors have temperature coefficient better than 50 ppm/° C. Switching states of the DPST switches 203 are defined according to the content of the DAC register 209, which stores the binary word $D_{FF}$ received by the digital input port 61. By way of example, the state of the first DPST switch labeled "S1" may be determined by the least significant bit (LSB) of the binary word $D_{FF}$, while the state of the last, i.e. Nth DPST switch labeled "SN" may be determined by the most significant bit (MSB) of the binary word $D_{FF}$. The output voltage $V_{out}$ is in accordance with equation (1) and is independent of R, 2R values. The input voltage $V_{in}$, such as $V_{in1}$, may be positive or negative, so that the MDAC 41 serves as a 4-quadrant multiplier, providing an analog output by multiplying the analog and digital inputs. MDACs based on the R/2R architecture which can be used in the OA controller 100 are commercially available from a variety of manufactures. Examples of commercially available MDACs which can be used in the present invention include AD5450, AD5451, AD5452 and AD5453 CMOS devices manufactured by Analog Devices Inc. These MDACS have a relatively low cost, a small footprint, and conveniently use a simple SPI (serial peripheral interface) interface as their digital input port. Although MDACs based on the R-2R ladder networks are currently preferred for the invention, other suitable types of MDAC can also potentially be used, for example MDACs based on binary-weighted resistor networks which include a series of resistors R, 2R, 4R, ... R×$2^{N-1}$ all connected in parallel.

Advantageously, commercially available MDACs are capable of providing an analog throughput bandwidth of 8 MHz or greater for signal transfer between the analog input and output ports, with a digital update rate of up to 2.5 Mega samples per second (Msps). The high analog bandwidth of the MDAC enables a fast rate of change of the pump current in the pump module 50, with large changes in the pump current affected over a time interval of 100 nanoseconds (ns) or faster, which makes the MDACs well suited for the FF control of the OA amplifier. As a further advantage, MDACs typically require only 3V to 8V of bias voltage; since they do not need a reference voltage, the input voltage can be as high as the bias voltage, and can be negative for a positive bias. Furthermore, MDACs typically have negligibly small temperature-related drifts and DC offsets that do not compromise the performance of the OA controller 100. These properties of MDACs, and in particular resisters-based MDACs such as that illustrated in FIG. 4, are highly advantageous for the FF portion of the OA controller 100.

Turning back to FIG. 3, the analog FF circuit of the OA controller 100, also referred to herein as the FF channel or the FF portion of the OA controller 100, extends from the first input port 31 to the output port 33 and includes the DPST switch 55, the FF MDAC 41, the TIA 51, and the summer 49. In operation the input optical signal from the input tap 3 of the OA as shown in FIG. 9 is fed into the input PD 44, which produces the first electrical signal in the form of the voltage $V_{in1}$. This voltage signal, which may be fast changing and have a bandwidth in excess of 2 MHz, is fed into the analog input port 62 of the MDAC 41 by means of the DPST switch 55. The analog DPST switch 55 is optional and is operational to disable the analog FF control circuit when desired. The processor 35 provides the first digital FF gain control signal 17 to the MDAC 41, setting the binary word $D_{FF}$ according to a desired target optical gain $G_t$ of the OA. The resulting output analog current $J_{out1}$ from the FF MDAC 41 is converted to the FF output voltage $V_{out1}$, by the TIA 51 or any other suitable current to voltage converter as would be known to those skilled in the art. In another embodiment, the FF MDAC 41 may directly output the output FF voltage $V_{out1}$, and the TIA 51 may be absent.

Figure 5:
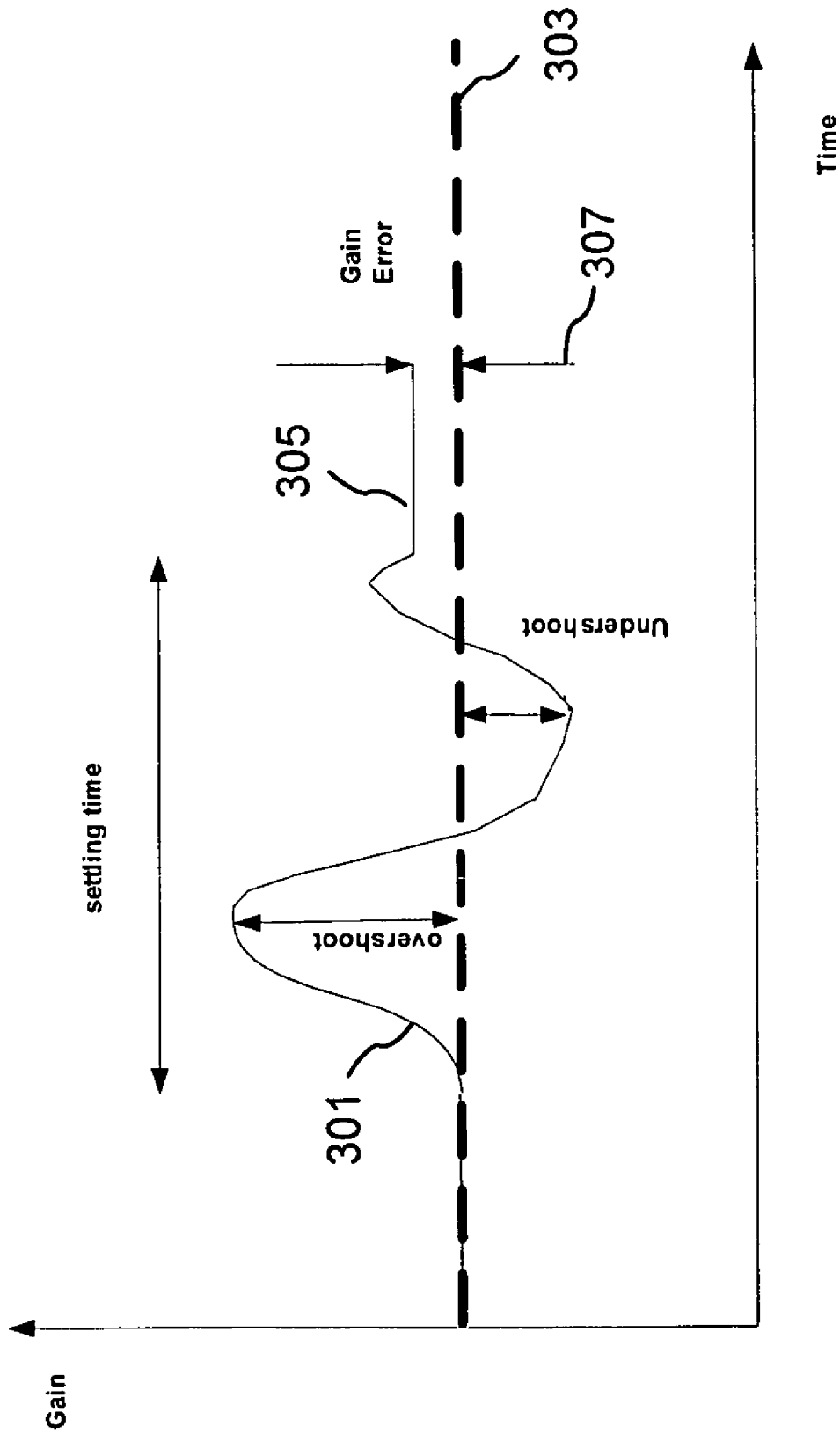
FIG. 5 is a schematic graph illustrating gain control in an optical amplifier.

Advantageously, the aforedescribed MDAC-based FF control circuit enables to quickly adjust the pump current $J_p$ in the pump module 50 when the input optical power into the OA abruptly changes; this is schematically illustrated in FIG. 5, showing by way of example a typical response 301 of the OA gain to an abrupt drop in the input optical power under the FF control. A drop in the input optical power typically results in a sudden increase in the OA gain G, which is offset by a decrease in the pump current that is affected by the FF control circuit, wherein the analog signal at the output of the FF MDAC 41 is proportional to the first electrical signal 11 from the input PD 44, and drops in proportion to the decrease in the input optical power to the OA. Similarly, a sudden increase in the input optical power, for example due to an addition of WDM channels, typically results in a sudden decrease in the OA gain G, which is offset by an increase in the pump current, since the analog signal at the output of the FF MDAC 41 increases in proportion to the increase in the input optical power to the OA. Under the FF control the OA gain G 301 relatively quickly settles to a constant value 305 after experiencing overshoot and undershoot excursions; however this new gain value 305 can differ from the target gain level 303 due to temperature and/or aging related changes in characteristics of the pump module 50 or other relevant system parameters. Therefore, currently preferred embodiments of the OA controller 100 include, in addition to the analog FF control portion described hereinabove, also a digital FB control portion, which in the shown embodiment is based on the processor 35, the ADCs 38 and 48, and a DAC 42 which in the shown embodiment is in the form of a second MDAC 42 having an analog input port thereof connected to a source of constant reference voltage 57 $V_{ref}$ which by way of example may be from 2.5 V to 4 V. The FB control portion of the OA controller 100 may be slower than the FF control portion and may be configured to fine-tune the OA gain to substantially eliminate the gain error 307 that remains after a "coarse" tuning by the FF control. Advantageously, the ADCs 38 and 48 may be relatively slow as the use of the fast MDAC in the analog FF circuit eliminates the need to implement the digital FB with a response time faster than about 2 to 4 μs. By way of example, the DAC 38 and 48 may have a sampling rate of less than 250 kilo samples per second (ksps). Furthermore, a simple 100 MHz microcontroller such as NXP's LPC 1700 series, Texas Instruments 320VC5502, 320F28xx microcontrollers or alike may be used as the processor 35, eliminating the need for a much faster processor that is required for an all-digital FF control implementation.

Turing again to FIG. 3, operation of the FB portion of the OA controller 100 in one embodiment thereof can be described as follows. The first and second electrical signals 11, 12 from the input and output PDs 44 and 36, respectively, are filtered by the anti-aliasing filters 47 and 37, and converted to first and second digital signals 13 and 15 by the two ADCs 48 and 38, which are then provided to the processor 35. The processor 35 may be programmed to compute a ratio of the first and second digital signals 13 and 17, which provides information about the actual gain G of the OA. The processor 45 may also implement a firmware PID algorithm to generate a digital FB signal 19, for example in the form of a binary word $D_{FB}$, that is provided to a digital input port 71 of the second MDAC 42, which is also referred to herein as the FB MDAC 42. An analog output port 73 of the FB MDAC 42 outputs an analog FB signal in the form of an output current $J_{out2}$ that is proportional to $D_{BF}$, which is converted to voltage $V_{out2}$ by a current to voltage converter 52, for example in the form of a TIA. The analog FB voltage signal $V_{out2}$ is then provided to the summer 49, where it is summed with the analog FF voltage signal $V_{out1}$. The output port 23 of the summer 49, which in the shown embodiment serves as the output port of the OA controller 100, provides the sum $V_s$ of the FF and FB voltages, $V_s=(V_{out1}+V_{out2})$, as the pump control signal 33 for controlling the pump current of the pump LD. Accordingly, the analog FF and FB voltage signals $V_{out1}$ and $V_{out2}$ define contributions of the analog FF control and the digital FB control, respectively, into the pump current $J_p$ produced by the LD driver in the pump module 50.

In one embodiment, the pump current $J_p$ is generally proportional to the pump control signal 33, i.e. to the summed voltage $V_s$. For a given OA gain G, the total pump current $J_p$ generated by the pump LD driver 50 is given by $$J_p = J_{FF} + J_{FB},$$

where the contributions from the analog FF and digital FB controls are given by the currents $J_{FF}$ and $J_{FB}$, respectively, with $J_{FF}$ being generally proportional to $V_{out1}$ and $J_{FB}$ being generally proportional to $V_{out2}$.

The processor 35 may implement a variety of algorithms for generating the digital FF and FB control signals $D_{FB}$ and $D_{FF}$, and those skilled in the art will be able to select control algorithms suitable for a particular application and for particular system requirements. In a preferred embodiment, the FF circuit operates as an open control loop, while the FB circuit operates as a closed loop. In one embodiment the $D_{FF}$ value may be set by the processor 35 using a stored therein look up table in accordance with a target OA gain and, optionally, in dependence upon one or more of other parameters such as the first digital signal 13 indicative of the input optical power of the OA, the second digital signal 15 indicative of the input optical power of the OA, a ratio thereof, temperature, etc, as appropriate for a particular application.

In one embodiment, the digital FB control signal $D_{FB}$ is selected so that the FB contribution $J_{FB}$ into the pump current provides a slowly varying offset that is responsible for the threshold current of the LD 50, fine-tunes the OA gain G and compensates for long-term drifts due to temperature and aging of the pump LD. The FF MDAC 41 provides a fast but coarse tuning of the optical gain G in the OA as described hereinabove. The FF related portion $J_{FF}$ of the pump current is proportional to the input optical power into the OA and to the OA target gain $G_t$. By way of example, for a given value of the LD pump current $J_p$, such as 1 Amp, the break up for the contribution from the FF and FB control signals may be as follows: $J_{FF}$>900 mA, $J_{FB}$<100 mA. In operation both the digital FB control signal $D_{FB}$ and the digital FF control signal $D_{FF}$ may be periodically updated by the processor 35, for example every 100 ns, to account for possible variations in the OA gain, such as those related to temperature.

With a suitably programmed processor 35, the OA controller 100 may operate in either a constant gain (CG) mode, a constant power (CP) mode, or a constant Current (CC) mode. In the CG mode, the FF and FB control signals $V_{out1}$ and $V_{out2}$ are selected in dependence on the first and second input electrical signals 11, 12 so as to maintain their ratio, and therefore the OA gain, at a constant target value. In the CP mode, the OA controller 100 operates to maintain a desired optical power level at the OA output, irrespective of the input optical signal to the OA. In this mode, the analog FF and digital FB controls in the OA controller 100 may be used similarly to the CG mode. In the CC mode, a constant pump current $J_p$ is set by the OA controller independently of the input optical power into the OA, i.e. independent on the first electrical signal 11. In this mode $D_{FF}$ may be set to zero, or the SPDT switch 55 is connected to ground to make $V_{in1}$=0. Advantageously, the MDAC-based architecture of the OA controller 100 is capable of supporting all three modes of operation, with suitable algorithms implemented in the processor 35 as will be known to those skilled in the art.

By way of example, testing of the OA controller 101 utilizing a 12-bit MDAC (AD5452) that was performed in the temperature range between −5° C. and 75° C., yielded the following results:

- less than 1 mV variation of the output voltage $V_s$ over the whole temperature range for all $D_{FF}$ and $D_{FB}$ values, which translates to a temperature drift in the pump current that is less than 1 mA;
- RMS noise of the output voltage Vs less than 300 μV, yielding a negligible noise in the pump current;
- less than 100 ns rise and fall times (5%-95%) of the output FF voltage $V_{out1}$ for a full-scale 0 to 5V transition in the input voltage $V_{in1}$, with full scale $D_{FF}$=4095;
- for $D_{FF}$=0, stepping $V_{in1}$ from 0 to 5V gave rise to 12 μV change at the output voltage $V_{out1}$, which provides a good isolation between the FF and the FB signals; accordingly, setting $D_{FF}$=0 effectively turns the analog FF contribution into the pump current to zero.

Figure 6:
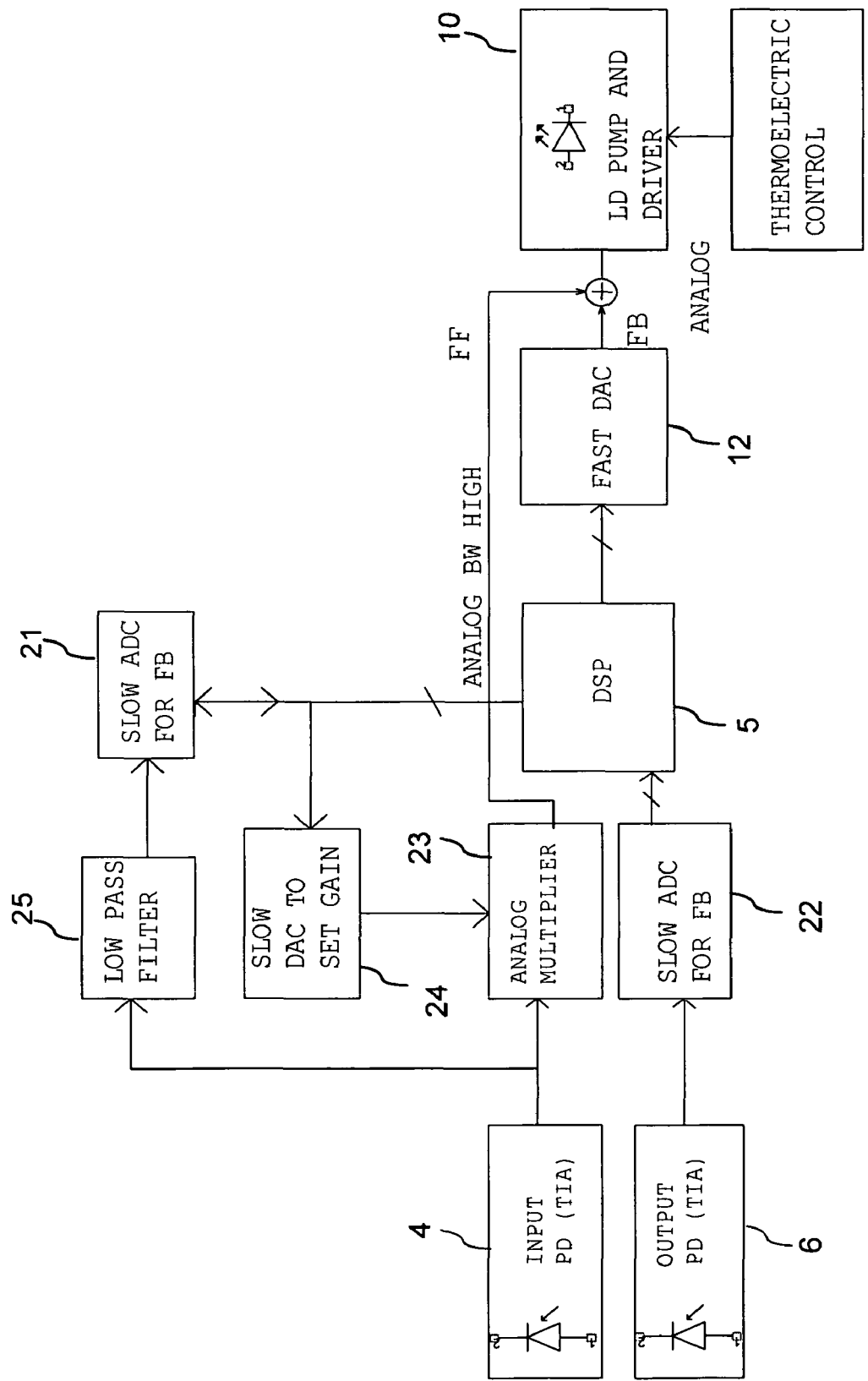
FIG. 6 is a block diagram of an OA controller with an FF circuit based on an analog multiplier.

Referring now to FIG. 6, an alternative OA controller 150 is shown that also implements a fast analog FF circuit and a slower digital FB circuit. The FF circuit is based on a 4-quadrant analog multiplier 23, which has a suitably large bandwidth, for example in excess of 4 MHz. A voltage signal from the input PD 4 is multiplied by an analog signal from a DAC 24, which digitizes a control signal from a DSP 5; the output of the analog multiplier gives the analog FF signal. A voltage signal from the output PD 6 is digitized by an ADC 22, and is used to calculate the digital FB control signal within the firmware of the DSP 5. The digital FB signal from the DSP 5 is sent to a fast DAC 12. The output of the fast DAC 12 is then summed with the analog FF signal to drive the LD pump 10. The analog multiplier 23 may be implemented using a voltage-controlled amplifier, or an amplifier and a variable attenuator. The analog FF channel may have a fast response and a relatively large bandwidth as determined by the analog multiplier 23, for example greater than 4 MHz.

Disadvantageously, analog multipliers suffer from DC-offsets and temperature related drifts, which make them very difficult to calibrate or use in manufacturing OAs. As a further disadvantage compared to the MDAC-based architecture described hereinabove with reference to FIG. 3, the OA controller architecture of FIG. 6 that is based on analog multipliers and/or voltage-controlled amplifiers is more expensive to implement.

Figure 2:
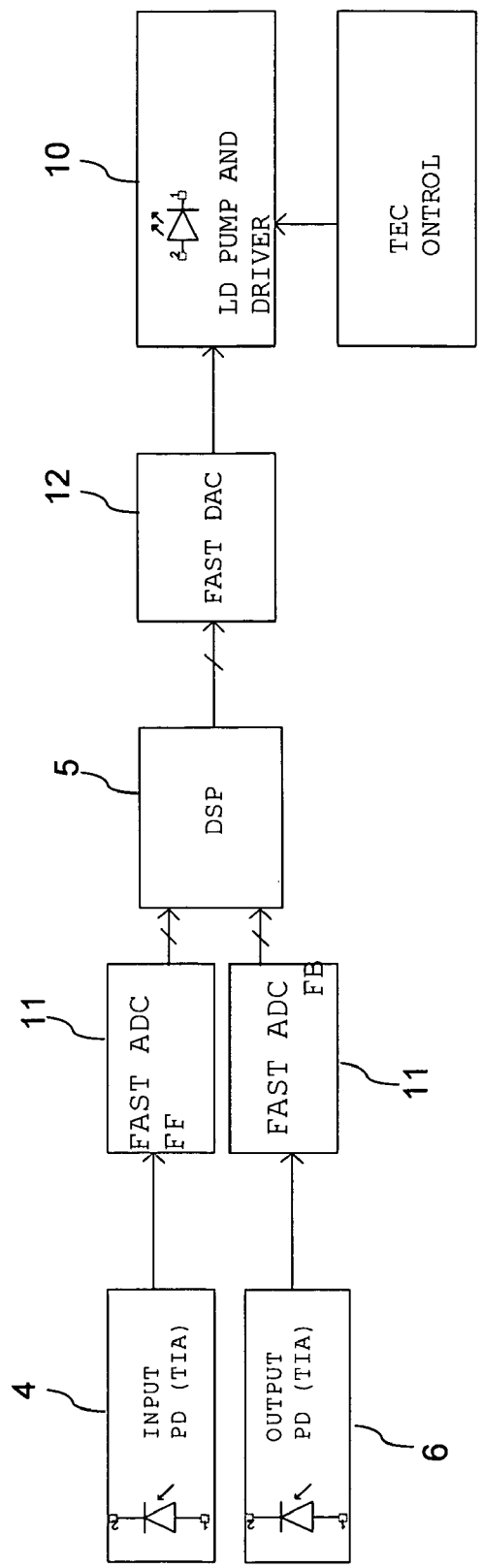
FIG. 2 is a block diagram of a digital controller of for controlling the gain of an optical amplifier according to prior art.

Table 1 summarizes advantages of MDAC-based OA controllers such as the OA controller 100, which typical parameters are given in row 4, compared to purely digital OA controllers such as that shown in FIG. 2 (second row), and OA controllers wherein the FF control channel is based on an analog multiplier, such as illustrated in FIG. 6 (third row). Advantageously, the MDAC-based architecture of the present invention has a lower power consumption, a lower DC offset, lower cost, smaller foot print, and better linearity of the FF channel than both the all-digital and the analog multiplier based architectures. Furthermore, the MDAC-based architecture of the OA controller of the present invention is characterised by temperature related drifts and DC offsets that are much smaller than that of the analog multiplier based design, and are comparable to or better than that of the all-digital design, and enable an update rate for the pump current that is superior to the all-digital design and is as fast as for the design based on the analog multiplier.

TABLE 1

| Parameters | All digital controller | Analog multipliers/ Variable gain amplifiers | MDAC-based controller |
| --- | --- | --- | --- |
| Power consumption | ~150 mW | ~20 mW | Less than 5 mW |
| DC-offset | Less than 3 mV | >5 mV (needs compensation circuits) | Less than 1 mV |
| Temperature related drifts | Low | High (needs compensation circuits) | Less than 1 mV from −5° C. to 80° C. |
| Approximate Cost | High (~$15 for fast ADC and DAC) | Medium (~$5 per analog multiplier) | Low (~$3 or less per MDAC) |
| Pump update rate | >300 ns | <100 ns | <100 ns |
| Board space | >2 sq.inches | >1 sq.inch | <0.25 sq.inches |
| Monotonicity, linearity and accuracy | Linearity better than 0.5% | Suffers from non-linearities. Linearity ~2% | Linearity better than 0.1% |
| Processor Complexity | Fast DSP ($25) | Low cost DSP/µcontroller (<$7) | Low cost DSP/µcontroller (<$7) |

Although the OA controller of the present invention having a MDAC-based FF control channel has been described hereinabove with reference to a particular exemplary embodiment shown in FIG. 3, it will be appreciated that the invention is not limited to this particular embodiment and encompasses other controller architectures having a MDAC-based analog FF control circuit.

For example, in some embodiments the FB MDAC 42 may be replaced by a conventional N-bit DAC. FIG. 7 illustrates such an OA controller 100a having a conventional DAC 42a in place of the FB MDAC 42.

Furthermore, although the OA controller 100 of FIG. 3 is shown to have electrical input and output ports 31-33 and does not include the input and output photodetectors 44, 46 and the pump module 50, in other embodiments the OA controller of the present invention may include the input and output photodetectors 44, 46 and/or the pump module 50. FIG. 8 illustrates such an embodiment, wherein an OA controller 100b includes the PDs 44 and 46, each of which including a photodiode followed by a TIA, and the pump module 50, which is shown to include the pump driver 55 and the LD 57.

With reference to FIG. 9, an aspect of the present invention provides an OA that includes the optically pumped gain element 8, the input optical tap 3 for tapping of a fraction of the input light entering the OA, the output optical tap 9 for tapping of a fraction of the output light leaving the OA, and a MDAC-based OA controller, such as the OA controllers 100 or 100b described hereinabove with reference to FIGS. 3 and 8. The gain element 8 may be in the form of a span of an erbium-doped fiber, or generally can be a suitably doped waveguide capable of amplifying light when optically pumped with suitable pump radiation.

With reference to FIG. 10, in another embodiment of the invention, the OA may include separate input PDs 44a and 44b for the FF and FB portions of the OA controller, which receive light from two separate input taps 3a and 3b, respectively, and generate two electrical signals 11a and 11b to serve as separate inputs for the FF control of the pump and for the digital FB control loop implemented with the processor 35.

Of course other embodiments are possible, as well as variations and modifications of the embodiments described hereinbelow; an ordinary person in the art would be able to construct such embodiments without undue experimentation in light of the present disclosure. For example, in one embodiment the OA controller may include only the FF circuit and not the elements that form the FB circuit of the controller 100, such as the LPF 37, ADC 38, and the FF MDAC 42. Such an embodiment would also not require the summer 49, so that the FF output voltage $V_{out1}$ is provided directly to the pump module 50. A variation of such an embodiment may utilize a MDAC having a voltage output that may be directly fed to the LD driver, in which case the output circuit 81 may be in the form of a simple electrical connector or feed. In other embodiments, the summer 49 may be a current summer rather than the voltage summer, and the TIAs 51, 52 may be replaced by a single TIA, or other suitable current to voltage converter, connected at the output of the summer 49.

Furthermore, although exemplary embodiments of the OA controller of the present invention have been described hereinabove with reference to an OA, such as the OA 1 of FIG. 1, having a single amplification stage 8, the OA controller of the present invention is also suitable for use in OAs with multiple amplification stages. Advantageously, the superior transient performance of the aforedescribed MDAC-based OA controller makes it suitable for use in long OA chains extending over multiple spans of long-haul communication networks.

It should be understood that each of the preceding embodiments of the present invention may utilize a portion of another embodiment Of course numerous other embodiments may be envisioned without departing from the scope of the invention as defined by appended claims.

We claim:

1. An apparatus for controlling a gain of an optical amplifier (OA), the optical amplifier comprising an optically pumped gain medium, the apparatus comprising:
   a first multiplying digital-to-analog converter (MDAC) having:
      an analog input port for receiving a first electrical signal indicative of an optical power of input light entering the OA,
      a digital input port for receiving a digital feed forward (FF) gain control signal $D_{FF}$, and an output port for outputting an analog FF signal that is proportional to the first electrical signal and to the FF digital gain control signal $D_{FF}$;

a processor coupled to the digital input port of the first MDAC for generating the FF digital gain control signal DFF;

an output circuit coupled to the output port of the first MDAC for outputting a pump control signal based at least in part on the analog FF signal for controlling a source of pump radiation of the OA.

2. The apparatus of claim 1, further comprising:
a first analog to digital converter (ADC) for receiving the first electrical signal, for converting the first electrical signal into a first digital signal, and for passing the first digital signals to the processor; and, a second ADC for receiving a second electrical signal indicative of an optical power of output light exiting the OA, for converting the second electrical signal into a second digital signal, and for providing said second digital signal to the processor.

3. The apparatus of claim 2, wherein the processor is programmed to generate the FF digital gain control signal DFF based upon a target gain value of the OA.

4. The apparatus of claim 2, wherein the processor is programmed to generate a feed back (FB) digital gain control signal DBF based on the first and second digital signals.

5. The apparatus of claim 4, further comprising a digital to analog converter (DAC) coupled to the processor for receiving the FB digital gain control signal DFB and for producing therefrom an analog FB signal, wherein the output circuit is coupled to the DAC and comprises a summer for producing the pump control signal based on a sum of the analog FF signal and the analog FB signal.

6. The apparatus of claim 5, wherein the DAC comprises a second MDAC having an analog input port coupled to a source of reference signal.

7. The apparatus of claim 1, wherein the analog FF signal produced by the first MDAC is a current signal, wherein the output circuit comprises a trans-impedance amplifier (TIA) for converting the analog FF signal into a voltage signal.

8. The apparatus of claim 1, wherein the first MDAC comprises an R/2R resistor network.

9. The apparatus of claim 1, further comprising a first photodetector for receiving a fraction of the input light and producing therefrom the first electrical signal.

10. The apparatus of claim 1, further comprising a pump driver for driving the source of pump radiation in dependence upon the pump control signal.

11. The apparatus of claim 2, further comprising anti-aliasing low pass filters for filtering the first and second electrical signals prior to passing thereof to the first and second ADCs, respectively.

12. The apparatus of claim 2, further comprising:
a first photodetector for receiving a fraction of the input light and producing therefrom the first electrical signal; and,
a second photodetector for receiving a fraction of the output light and producing therefrom the second electrical signal.

13. The apparatus of claim 1 wherein the first MDAC has an analog throughput bandwidth of at least 2 MHz.

\* \* \* \* \*